United States Patent
Tews et al.

(10) Patent No.: US 6,579,766 B1
(45) Date of Patent: Jun. 17, 2003

(54) DUAL GATE OXIDE PROCESS WITHOUT CRITICAL RESIST AND WITHOUT $N_2$ IMPLANT

(75) Inventors: Helmut H. Tews, Unterhaching (DE); Ravikumar Ramachandran, Pleasantville, NY (US); Kilho Lee, Wappingers Falls, NY (US)

(73) Assignee: Infineon Technologies AG, Munich (DE)

( * ) Notice: Subject to any disclaimer, the term of this patent is extended or adjusted under 35 U.S.C. 154(b) by 1 day.

(21) Appl. No.: 10/077,518

(22) Filed: Feb. 15, 2002

(51) Int. Cl.⁷ .............................................. H01L 21/336
(52) U.S. Cl. ...................... 438/275; 438/283; 438/294; 438/763
(58) Field of Search ................. 438/225, 283, 438/287–289, 681–685, 217, 291, 294, 763, 199, 218, 400, 279; 257/324, 263, 765

(56) References Cited

U.S. PATENT DOCUMENTS

| | | | |
|---|---|---|---|
| 5,702,970 A | * | 12/1997 | Choi .............................. 438/3 |
| 5,863,819 A | * | 1/1999 | Gonzalez ..................... 438/238 |
| 5,960,289 A | | 9/1999 | Tsui et al. |
| 5,985,725 A | | 11/1999 | Choi |
| 6,030,862 A | | 2/2000 | Kepler |
| 6,033,943 A | | 3/2000 | Gardner |
| 6,063,670 A | | 5/2000 | Lin et al. |
| 6,080,682 A | | 6/2000 | Ibok |
| 6,087,259 A | * | 7/2000 | Lee ............................. 438/681 |
| 6,261,972 B1 | | 7/2001 | Tews et al. |
| 6,262,455 B1 | | 7/2001 | Lutze et al. |
| 6,297,103 B1 | | 10/2001 | Ahn et al. |

OTHER PUBLICATIONS

Sze, S.M. "Semiconductor Devices Physics and Technology" 1985 MOSFET Technology Ch. 12, pp. 481–485.

* cited by examiner

Primary Examiner—Olik Chaudhuri
Assistant Examiner—Yennhu B. Huynh
(74) Attorney, Agent, or Firm—Slater & Matsil, L.L.P.

(57) ABSTRACT

A process as shown in FIGS. 1A through 1I, or FIGS. 2A through 2I for providing first areas of gate oxide (30, 30A, 30B) on a substrate (10) having a first thickness and second adjacent areas (32, 32A, 32B) of gate oxide having a lesser thickness without the use of a $N_2$ implantation process.

16 Claims, 2 Drawing Sheets

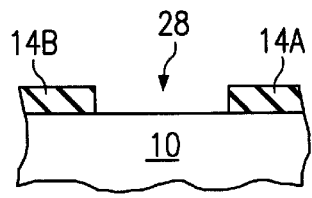
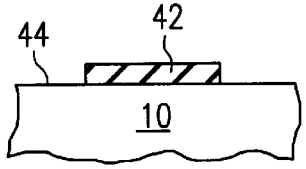
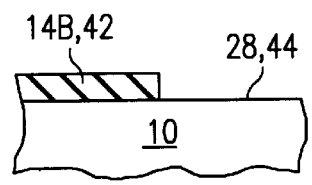
FIG. 1F          FIG. 2F          FIG. 3F
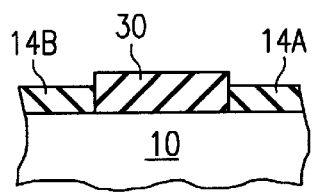
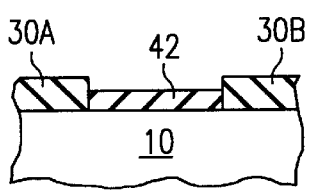
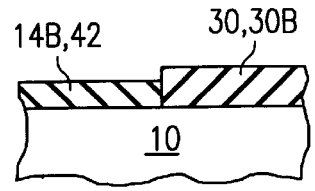
FIG. 1G          FIG. 2G          FIG. 3G
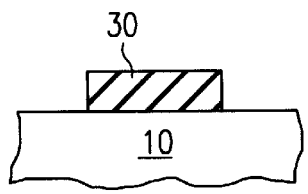
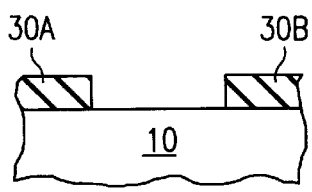
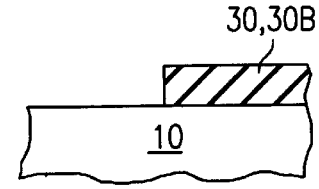
FIG. 1H          FIG. 2H          FIG. 3H
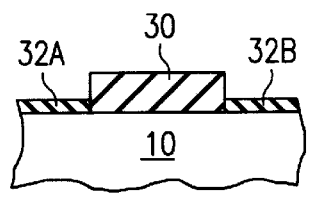
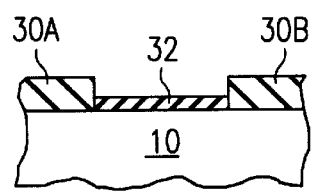
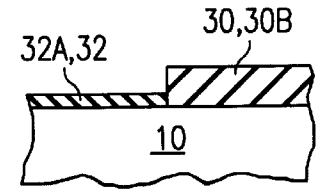
FIG. 1I          FIG. 2I          FIG. 3I

DUAL GATE OXIDE PROCESS WITHOUT CRITICAL RESIST AND WITHOUT N₂ IMPLANT

TECHNICAL FIELD

The present invention relates to the manufacture of semiconductor devices, and more particularly, to the manufacture of semiconductor devices requiring multiple oxides with different thickness with high ratios between thick and thin oxide layers such as used in dual gate oxide CMOS devices.

BACKGROUND OF THE INVENTION

As will be understood by those skilled in the art, processes presently used for manufacturing semiconductor devices having a large ratio between areas of thin oxide and areas of thick oxide with large thickness differences such as used for dual gate devices, typically require an $N_2$ implant and/or a critical resist process.

In N2 implant processes, the wafer is covered with a sacrificial layer, e.g. a thin oxide. Some areas of the wafer are covered with resist, while others are exposed. N2 implantation is performed through a sacrificial oxide in the exposed areas. After resist strip and sacrificial oxide strip, the gate oxidation is performed. The oxide thickness is reduced in N2 implanted areas. The problem with this scheme is that relatively high N2 implant doses are required for large oxide thickness differences, that is, a large ratio between the thick and thin gate oxide. In addition, the effect of oxidation retardation by N2 implant is only efficient at relatively high oxidation temperatures. High temperatures, however, lead to diffusion of the implanted species that are critical for the device definition, resulting in a device degradation. Even with high oxidation temperatures it is difficult to get differences in oxide thickness between the thick oxide and the thin oxide of a factor of 2 or higher.

Alternatively, resist processes are used which allow for arbitrarily large thickness ratios between thin and thick oxide. In a resist process, a first oxide is grown on all silicon surfaces. In the following step, resist is applied. The resist covers some areas of the wafer, while leaving other areas exposed. The oxide is etched in the exposed areas, e.g. by wet chemical oxide etch. After resist strip, a second oxidation is performed. Problems with this scheme are contamination of the oxide layer with residues from the resist or from the resist processing steps.

Therefore, it is an object of this invention to provide a method of forming areas of oxide on a substrate having a thin oxide layer, and other areas of oxide on the substrate with relatively thick oxide layers.

It is another object of the invention to form such thick and thin oxide areas without implanting $N_2$.

It is still another object of the invention to form such thick and thin oxide areas without the use of a critical resist process such that at no time the resist is present on exposed silicon areas before oxidation, or on the final oxide layer.

SUMMARY OF THE INVENTION

Other objects and advantages of the invention will in part be obvious, and will in part appear hereinafter, and will be accomplished by the present invention which provides a process for forming a semiconductor circuit on a substrate having first and second areas with different thicknesses of oxide. The process comprises the steps of providing a substrate having at least one or more exposed areas and one or more adjacent areas that are covered by a nitride layer. An oxide having a first thickness is then formed over the exposed areas of the substrate. The nitride layer is then removed from the adjacent areas such that the substrate now has one or more areas with oxide of the first thickness, and one or more newly exposed substrate areas. The newly exposed areas, of course, result from the removal of the nitride layer. An oxide is then formed on the newly exposed areas and has a second thickness. The second thickness is less than the first thickness formed over the first original exposed areas.

According to a first embodiment of the invention, the substrate having the exposed areas or area, and the adjacent area or areas covered by a nitride layer may be formed, according to the first embodiment, by depositing a nitride layer over a surface of the substrate. The layer of nitride is then itself covered by depositing a sacrificial oxide layer over the nitride layer. The sacrificial oxide layer is then patterned by depositing a mask over the sacrificial oxide layer to provide at least one protected area of the oxide layer protected by the mask and to leave at least one area of the sacrificial oxide layer exposed. The exposed area or areas of the sacrificial oxide layer is then removed from the substrate such as by etching. Removal or etching of the sacrificial oxide layer exposes a first area of the nitride layer that was previously covered by the oxide layer.

Subsequent to the etching of the exposed sacrificial oxide layer, the mask is then removed so as to expose the areas of the oxide layer protected by the mask pattern. Thus, at this point, the structure includes patterned areas of the sacrificial oxide layer and adjacent areas covered by a nitride layer. The exposed first areas of the nitride layer are then etched all the way down to the substrate by a process selective to the sacrificial oxide layer to leave exposed areas of the substrate. Of course, since the etching process is selective to the sacrificial oxide, the areas covered by the oxide layer are not etched.

The exposed areas of the oxide layer, which were originally protected by the mask, are removed by a suitable process, thereby leaving the substrate such that it now comprises at least one exposed area of the substrate and at least one adjacent area of the substrate covered by a nitride layer.

As will be discussed hereinafter, a substrate having one or more exposed areas and one or more adjacent areas covered by a nitride layer form a basic structure for providing first areas having an oxide of a first thickness and second areas having a second thickness which is different from the first thickness.

Further, a substrate having one or more exposed areas and one or more adjacent nitride covered areas may also be produced by a second embodiment of the invention. This second embodiment of the invention comprises the steps of depositing a sacrificial oxide layer over the top surface of the substrate and then depositing a first nitride layer over the sacrificial oxide layer. A resist mask is then deposited over the first nitride layer so as to provide at least one protected or patterned area of the first nitride layer, while at the same time, leaving exposed adjacent areas of the first nitride layer. The areas on the substrate having an exposed nitride layer are then subjected to a process for removing the exposed nitride layer so as to expose a first area or areas of the sacrificial oxide layer that were beneath or below the nitride layer. The mask is then stripped to uncover the protected area of the first nitride layer, the first area or areas of the sacrificial oxide layer exposed by the previous etching of the exposed nitride layer are then etched to expose an area or areas of the substrate. The etching of the sacrificial oxide layer is selective to the nitride layer. Therefore, the areas of the substrate that are exposed are those areas that were beneath the sacrificial oxide layer.

The areas of the first nitride layer that were previously protected by the mask are now removed or etched so as to expose second areas of the sacrificial oxide layer which were below the nitride layer. A second nitride layer is then deposited over the exposed area of the substrate so as to form the adjacent areas of the substrate as discussed above. The second areas of the sacrificial oxide layer that were previously covered by the first nitride layer are then removed or etched to form the exposed areas of the substrate.

Therefore, it is seen either the first or second embodiments of the invention may be used to obtain a substrate having one or more exposed areas and one or more adjacent areas covered by a nitride layer. A substrate patterned with first areas with exposed substrate and adjacent areas having a nitride layer is then subjected to a process which forms an oxide having a first thickness over the exposed areas. The adjacent areas having a nitride layer are then stripped to remove the nitride layer and leave adjacent areas of exposed substrate.

Finally, oxide is formed on the adjacent areas of exposed substrate. The oxide forms on the adjacent areas has a second thickness that is less than the thickness of the first oxide.

BRIEF DESCRIPTION OF THE DRAWINGS

The above-mentioned features as well as other features of the present invention will be more clearly understood from the consideration of the following description in connection with accompanying drawings in which:

FIG. 1A–FIG. 1I is a flow diagram of a first embodiment of the invention for forming a substrate with patterned nitride areas that is then processed to form areas of oxide having a first thickness and other areas of oxide having a second thickness which is different than the first thickness.

FIG. 2A–FIG. 2I is a flow diagram of a second embodiment of the invention for forming a substrate having exposed areas of the substrate and adjacent areas covered by a nitride layer.

FIG. 3F–FIG. 3I (there are no FIGS. 3A–3E) is a flow diagram of the process of forming thick and thin oxide areas on a substrate having patterned nitride areas according to the teachings of the invention of FIG. 1A–FIG. 1I and FIG. 2A–FIG. 2I.

Corresponding numerals and symbols in the different figures refer to corresponding parts unless otherwise indicated. The figures are drawn to clearly illustrate the relevant aspects of the preferred embodiments, and are not necessarily drawn to scale.

DETAILED DESCRIPTION OF PREFERRED EMBODIMENTS

Figure 1A:
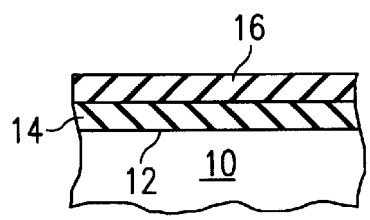
Figure 1B:
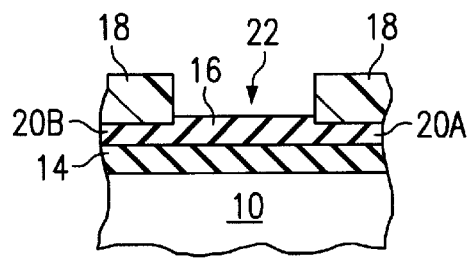

Referring now to the diagram of FIGS. 1A–1E, it is seen that according to a first embodiment of the manufacturing process of this invention, there is a substrate 10 such as for example a silicon substrate having a top surface 12 covered by a thin nitride layer 14. The nitride layer 14 may typically be deposited by a CVD (chemical vapor deposition) process so as to provide a layer of between 60 and 100 Angstroms. The thin nitride layer 14 is then covered by a thin oxide layer 16. The oxide layer 16 will typically have a thickness of between 30 to 50 Angstroms and may for example be produced by an ISSG transformation of a part of the nitride layer 14. As will be appreciated by those skilled in the art, this layer stack as shown in FIG. 1A represents the sacrificial oxide that may be used for device implants if necessary.

Figure 1C:
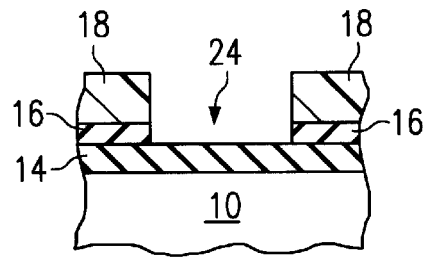

The substrate having the nitride layer 14 and oxide layer 16 then receives a resist mask 18 which protects certain areas 20a and 20b of the oxide layer 16 and leaves other areas of the oxide layer exposed such as shown by reference numeral 22. The exposed area 22 of the oxide layer is then etched, such as for example, by a wet etch so as to remove the exposed areas of the oxide layer 16 down to the nitride layer 14 as shown in FIG. 1C. A particularly suitable chemistry or etching the oxide layer is a 40:1 BHF (Buffered Hydro Fluoric) acid mixture having 40 parts of NH4F and one part of HF which is well known in the art. Other dilute mixtures of NH4F and HF in various composition ratios would also be applicable. After, exposed areas 22 of the oxide layer 16 have been etched, the mask 18 is then removed by a typical process such as by plasma process followed by a wet cleaning step, using standard resist strip mixtures such as sulfuric acid and hydrogen peroxide or ozone at elevated temperatures. It will of course be appreciated that at this point, there is no silicon exposed as the nitride layer 14 is still in place as shown by reference number 24 in FIG. 1C.

Figure 1D:
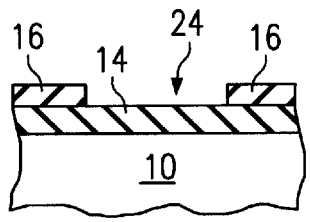
Figure 1E:
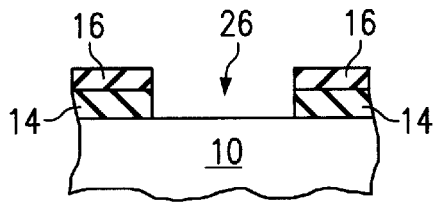
Figure 2E:
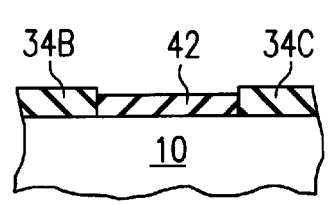

After removal of the mask 18 as shown in FIG. 1D, the exposed nitride area or portion 24 which was originally below the oxide layer 16 removed in the previous step, is etched with a chemistry that is selective to the oxide. This nitride etch may be performed as a dry or wet etch such as by a high temperature solution containing phosphoric acid. This leaves the structure such as shown in FIG. 1E.

Following the etch of portion 24 of nitride layer 14 down to the surface 26 of substrate 10, the remaining (now exposed) areas of oxide layer 16 are removed from the top of the nitride layer 14 such that the substrate structure is now comprised of at least one area of nitride (such as areas 14A and 14B) and at least one adjacent area of the exposed substrate, such as the exposed area 28 of substrate 10 shown in FIG. 1F.

The substrate structure of FIG. 1F having exposed area 28 and areas covered by nitride (14A and 14B), is then subjected to a process selective to nitride, such as a thermal oxidation process, within a temperature range between 750° C. to 900° C. depending on the desired oxide thickness, for forming the thick gate oxide layer 30 at the exposed areas 28 of substrate 10 as shown in FIG. 1G. Dry oxidation (using $O_2$ or diluted $O_2$) or wet oxidation ($O_2+H_2O$) may be used. A typical thick oxide layer would be about 50 Angstroms. Then, as shown in FIG. 1H, the remaining nitride areas (14A and 14B) are removed by an etch or nitride strip selective to oxide. Thin oxide areas, such as areas 32A and 32B shown in FIG. 1I, are then formed on the exposed areas of substrate 10 left after the nitride etch, by subjecting the structure to a second oxidation process. The second oxidation process may for example be a low thermal oxidation process carried out in a furnace at between about 600° C–750° C. or preferably, a rapid thermal oxidation process (RTO) having a duration on the order of 10 seconds may be used. Another method for obtaining the second gate oxide thickness is to perform a wet oxidation with oxygen radicals, even without stripping the silicon nitride film.

Figure 2A:
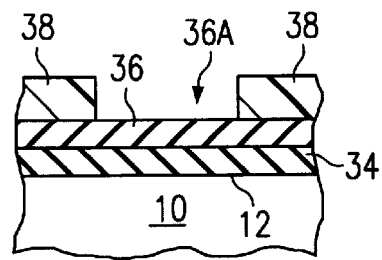
Figure 2B:
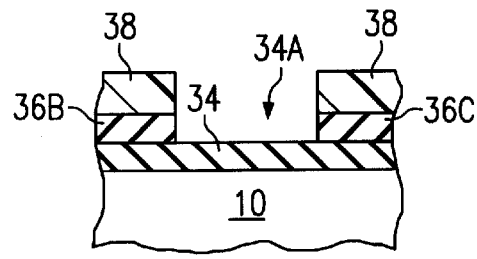
Figure 2C:
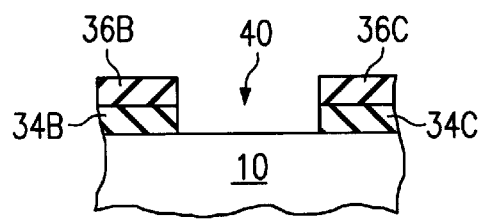
Figure 2D:
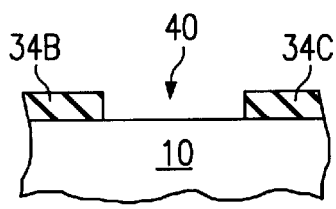

Therefore, referring now to FIGS. 2A through 2F, there are shown drawings representative of the process steps of the second embodiment. As shown, a surface 12 of substrate 10 is covered by a sacrificial oxide layer 34. A suitable process for depositing the sacrificial oxide layer 34 is the thermal oxidation process. Sacrificial oxide layer 34 is then itself covered by a thin nitride layer 36 using any suitable deposition process such as the CVD process and is typically deposited to a thickness of between 30 and 50 Angstroms, as was the nitride layer 14 of the first embodiment. Thus, at this point, the structure comprises a substrate 10, a sacrificial oxide layer 34 covered by a nitride layer 36. At this point, it will be appreciated by those skilled in the art that if any implants are required for the devices being formed, such implantation will be accomplished at this time. After the necessary implantation for the devices to be formed, a mask 38 is then formed of an oxide for patterning the nitride layer 36. After formation of the mask 38 to pattern the nitride layer 36, the nitride layer 36 is then etched such as by a dry or wet etch so that it stops at the sacrificial oxide layer 34. Any suitable dry or wet nitride etch may be used for this process. A high temperature solution containing phosphoric acid is an excellent example. Therefore, after the exposed areas 36A of nitride layer 36 have been etched, the structure appears as shown in FIG. 2D. Thus, as shown in FIG. 2b, substrate 10 is covered by a layer of sacrificial oxide 34 and areas of nitride such as shown at 36B and 36C as patterned by the resist layer 38.

The mask 38 or resist is then removed by a typical process (such as for example a plasma process) followed by a wet cleaning step using standard resist strip mixtures such as sulfuric acid and hydrogen peroxide or ozone at elevated temperatures. The exposed sacrificial area 34A of oxide layer 34 may then be subjected to an oxide etch which is selective to nitride. A particularly suitable chemistry for etching the oxide layer will be selective to the nitride layers as was discussed above. That is, a 40:1 BHF (Buffered Hydro Fluoric) acid mixture having 40 parts of NH4F and one part of HF. Other dilute mixtures of NH4F and HF in various composition ratios would also be applicable. Thus, after the oxide area 34A is etched, the structure of the substrate and layers will be that as shown in FIG. 2C. Wherein as shown, substrate 10 has one or more exposed areas 40, patterned areas 34B and 34C of oxide layer 34 and nitride layers 36B and 36C. The patterned areas 36B and 36C of nitride layer 36 are then etched such that the structure of FIG. 2d is formed. Thus, as shown in FIG. 2D, there is at least one exposed area 40 of substrate 10 and other areas of substrate 10 covered by patterned areas 34B and 34C of sacrificial oxide layer 34.

The one or more exposed area(s) 40 of substrate 10 are then subjected to a selective nitridation at a temperature of 750° C. or higher to form a 10 Angstrom nitride layer 42 or even a greater thickness at a higher temperature. Thus, after the nitridation process, the structure is that shown in FIG. 2F. Therefore, as seen in FIG. 2F, there are patterned areas 42 of nitride covering substrate 10 and the remaining areas of the substrate 10 surface are covered by the remaining portions 34B and 34C of the sacrificial oxide layer 34. The structure of FIG. 2F is then subjected to an oxide etch selected to nitride such that the remaining areas 34B and 34C of the sacrificial oxide layer 34 are removed while leaving in place the patterned nitride areas 42 on the surface. Thus, the structure of FIG. 2F is formed, which as shown, represents at least one area 44 of exposed substrate 10 and at least one patterned area 42 of nitride. Thus, it will be appreciated that the structure of 2F is similar to that shown in FIG. 1F in that there are nitride covered areas 42 and exposed areas 44 of substrate 10. Thus, in the same manner as was discussed in the first embodiment, the structure of FIG. 2F may then be subjected to formation of thick gate oxide 30A and 30B, followed by removal of the nitride pattern 42. Also as discussed with respect to the first embodiment, after removal of the nitride layer 42, the thin gate oxide layer 42C may then be formed at the exposed areas of substrate 10.

FIGS. 3F through 3I illustrate how the last three steps for forming the thick oxide layer and the thin oxide layer are the same for both embodiments. For example, FIG. 3F through FIG. 3I is the same as the left two portions of FIG. 1F through FIG. 1I and the right two portions of FIG. 2F through FIG. 2I.

Thus, there has at this point been described embodiments of the unique method of this invention for providing first areas of an oxide of a first thickness and second areas of oxide having a second and different thickness. Although the present application has been described with respect to specific process steps, it is not intended that such specific references be considered as limitations upon the scope of the invention except as set forth in the following claims.

What is claimed is:

1. A process for forming a semiconductor circuit on a substrate having first and second areas with different thickness of oxide comprising the steps of:

providing a substrate, said substrate having a first area of a top surface of said substrate covered by a contiguous nitride layer and an adjacent exposed area of said top surface;

forming an oxide by a process selective to nitride and having a first thickness on said adjacent exposed area of said top surface of said substrate;

removing said contiguous nitride layer to expose said first area of said top surface; and forming an oxide having a second thickness on said exposed top surface of said first area wherein said second thickness is less than said first thickness.

2. The process of claim 1 wherein said process forms dual gate oxide of different thicknesses.

3. The process of claim 1 wherein said substrate is made of silicon.

4. The process of claim 1 wherein said nitride layer is deposited on said substrate by chemical vapor deposition (CVD).

5. The process of claim 1 wherein said nitride layer as a thickness of between 30 and 50 Angstroms.

6. The process of claim 1 wherein said oxide of said first thickness is formed by a thermal oxidation process at a temperature range of between 750° C. to 900° C.

7. The process of claim 6 wherein said oxide having a first thickness is about 50 Angstroms thick.

8. The process of claim 1 wherein the step of removing said nitride layer is by etching said nitride with a process selective to oxide.

9. The process of claim 1 wherein said step of forming an oxide having a second thickness is formed by rapid thermal oxidation at a temperature range of between about 600° C. and 750° C.

10. The process of claim 1 wherein said step of providing comprises the steps of:

depositing a nitride layer on said top surface of said substrate;

forming a sacrificial oxide layer over said nitride layer;

depositing a mask over said sacrificial oxide layer to provide a protected area of said sacrificial oxide layer and to leave an exposed area of said sacrificial oxide layer;

removing said exposed sacrificial oxide layer to exposed a first area of said nitride layer;

removing said mask so as to expose said protected area of said sacrificial oxide layer;

etching said exposed first area of said nitride layer to leave an exposed area of said substrate; and removing said exposed protected area of said oxide layer such that said substrate includes said adjacent exposed area of said top surface of said substrate and said first area of said top surface of said substrate covered by said contiguous nitride layer.

11. The process of claim 10 wherein said step of forming an oxide layer is by oxidation of the deposited nitride layer.

12. The process of claim 11 wherein said nitride layer is formed to a thickness of between about 30 and 50 Angstroms.

13. The process of claim 10 wherein said substrate is made of silicon.

14. The process of claim 1 wherein said step of providing a substrate comprises the steps of:

depositing a sacrificial oxide layer on said top surface of said substrate;

depositing a first nitride layer over said sacrificial oxide layer;

depositing a mask over said first nitride layer so as to provide a protected area of said first nitride layer to leave an exposed area of said first nitride layer;

removing said exposed area of said first nitride layer so as to expose a first area of said sacrificial oxide layer;

stripping said mask to uncover said protected area of said first nitride layer;

etching said first area of said sacrificial oxide layer to expose an area of said substrate;

removing said protected area of said first nitride layer so as to expose a second area of said sacrificial oxide layer;

forming a second nitride layer over said exposed area of said substrate to form said first area of a top surface of said substrate covered by a contiguous nitride layer; and removing said second area of sacrificial oxide layer to form said adjacent exposed area of said top surface of said substrate.

15. The process of claim 14 wherein said substrate is made of silicon.

16. A process for forming a semiconductor circuit on a substrate having first and second areas with different thickness of oxide comprising the steps of:

depositing a sacrificial oxide layer over said substrate;

depositing a first nitride layer over said sacrificial oxide layer;

depositing a mask over said first nitride layer so as to provide a protected area of said first nitride layer and leave an exposed area of said first nitride layer;

removing said exposed area of said first nitride layer so as to expose a first area of said sacrificial oxide layer;

stripping said mask to uncover said protected area of said first nitride layer;

etching said first area of said sacrificial oxide layer to expose a first area of said substrate;

removing said protected area of said first nitride layer so as to expose a second area of said sacrificial oxide layer;

forming a second nitride layer over said exposed first area of said substrate;

removing said second area of said sacrificial oxide layer to form an adjacent exposed area of said substrate;

forming an oxide by a process selective to nitride and having a first thickness over said adjacent exposed area;

removing said second nitride layer from said first area; and forming an oxide having a second thickness over said first area wherein said second thickness is less than said first thickness.

* * * * *